(12) United States Patent
Grodzki et al.

(10) Patent No.: US 10,012,710 B2
(45) Date of Patent: *Jul. 3, 2018

(54) METHOD AND MAGNETIC RESONANCE APPARATUS FOR OPTIMIZATION OF A MAGNETIC RESONANCE SEQUENCE

(71) Applicant: Siemens Aktiengesellschaft, Munich (DE)

(72) Inventors: David Grodzki, Erlangen (DE); Bjoern Heismann, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 666 days.

This patent is subject to a terminal disclaimer.

(21) Appl. No.: 14/516,885

(22) Filed: Oct. 17, 2014

(65) Prior Publication Data

US 2015/0108981 A1    Apr. 23, 2015

(30) Foreign Application Priority Data

Oct. 17, 2013    (DE) .................... 10 2013 221 062

(51) Int. Cl.
| | |
|---|---|
| *G01V 3/00* | (2006.01) |
| *G01R 33/385* | (2006.01) |
| *G01R 33/36* | (2006.01) |
| *G01R 33/54* | (2006.01) |
| *G01R 33/565* | (2006.01) |

(52) U.S. Cl.
CPC ..... *G01R 33/3852* (2013.01); *G01R 33/3671* (2013.01); *G01R 33/543* (2013.01); *G01R 33/56509* (2013.01); *G01R 33/3854* (2013.01)

(58) Field of Classification Search
USPC .......................................................... 324/318
See application file for complete search history.

(56) References Cited

U.S. PATENT DOCUMENTS

| | | | | |
|---|---|---|---|---|
| 5,512,825 A | * | 4/1996 | Atalar | G01R 33/4833 324/303 |
| 6,198,282 B1 | * | 3/2001 | Dumoulin | G01R 33/3852 324/307 |

(Continued)

OTHER PUBLICATIONS

"Making MRI Scanning Quieter: Optimized TSE Sequences with Parallel Imaging," Pierre et al., MAGNETOM Flash May 2013, pp. 30-34 (2013).

*Primary Examiner* — Rodney Fuller
(74) *Attorney, Agent, or Firm* — Schiff Hardin LLP

(57) ABSTRACT

In a method to optimize a magnetic resonance sequence of a magnetic resonance apparatus and a magnetic resonance apparatus operated according to such a method, optimization of the timing of the magnetic resonance sequence is implemented by adopting a magnetic resonance sequence as a starting sequence includes a first time interval set of one or more first time intervals and a second time interval set of one or more second time intervals, wherein the first time intervals of the first time interval set are to be left unmodified with regard to an optimization of the duration. The magnetic resonance sequence is automatically analyzed to identify the first time intervals of the first time interval set and the second time intervals of the second time interval set in the magnetic resonance sequence. The duration of at least one second time interval of the second time interval set is then automatically optimized.

15 Claims, 6 Drawing Sheets

(56) References Cited

U.S. PATENT DOCUMENTS

| | | | |
|---|---|---|---|
| 7,176,687 B2* | 2/2007 | Jenniskens | G01R 33/5615 |
| | | | 324/309 |
| 2008/0024129 A1 | 1/2008 | Heid | |
| 2014/0232396 A1 | 8/2014 | Grodzki et al. | |
| 2015/0204959 A1* | 7/2015 | Grodzki | G01R 33/543 |
| | | | 324/314 |
| 2016/0238681 A1* | 8/2016 | Biber | G01R 33/3852 |
| 2016/0291111 A1* | 10/2016 | Pfeuffer | G01R 33/5607 |

\* cited by examiner

METHOD AND MAGNETIC RESONANCE APPARATUS FOR OPTIMIZATION OF A MAGNETIC RESONANCE SEQUENCE

BACKGROUND OF THE INVENTION

Field of the Invention

The invention concerns a method to optimize a magnetic resonance sequence of a magnetic resonance apparatus, a method to operate a magnetic resonance apparatus, a sequence optimization unit, a magnetic resonance apparatus, and a non-transitory, computer-readable data storage medium encoded with programming instructions that, when the storage medium is loaded into a computer of a magnetic resonance apparatus, cause the magnetic resonance apparatus to execute such a method.

Description of the Prior Art

In a magnetic resonance apparatus (also called a magnetic resonance tomography system), the body of an examination subject (in particular a patient) that is to be examined is typically exposed to a relatively high basic magnetic field—for example of 1, 5, 3 or 7 Tesla—with the use of a basic field magnet. A magnetic field gradient is additionally applied by a gradient coil arrangement. Radio-frequency pulses (in particular excitation signals) are emitted via a radio-frequency antenna unit, which cause the nuclear spins of specific atoms in the patient to be excited to resonance by being flipped (deflected) relative to the magnetic field lines of the basic magnetic field. Upon relaxation of the nuclear spins, radio-frequency signals (known as magnetic resonance signals) are radiated, which are received by suitable radio-frequency antennas, and then processed further. The desired image data are reconstructed from the raw data acquired in such a manner.

For a defined measurement, a defined magnetic resonance sequence (also called a pulse sequence) is emitted that is composed of a series of radio-frequency pulses (in particular excitation pulses and refocusing pulses) as well as gradient switchings (gradient pulse activations) emitted in different spatial directions in coordination with the RF pulses. Readout windows must be set to match these pulses chronologically, these readout windows predetermining the time periods in which the induced magnetic resonance signals are received. In particular the time arrangement (the timing) within the magnetic resonance sequence—i.e. at which time intervals and/or in which chronological order which radio-frequency pulses and/or gradient switchings follow one another—is significant to the imaging.

SUMMARY OF THE INVENTION

An object of the invention is to provide an advantageous optimization of the timing of a magnetic resonance sequence.

A method in accordance with the invention to optimize a magnetic resonance sequence of a magnetic resonance apparatus, has the following steps. A magnetic resonance sequence is adopted (selected) as a starting sequence, which includes a first time interval set of one or more first time intervals and a second time interval set of one or more second time intervals, wherein the first time intervals of the first time interval set are to be left unchanged with regard to an optimization of the duration. The magnetic resonance sequence is automatically analyzed in a processor (computer) to identify the first time intervals of the first time interval set and the second time intervals of the second time interval set in the magnetic resonance sequence. The processor automatically optimizes the duration of at least one second time interval of the second time interval set.

A magnetic resonance sequence that is in finished form—i.e. ready for emission—but still optimizable in the method according to the invention is preferably adopted as the starting sequence. This magnetic resonance sequence typically includes a radio-frequency pulse set of one or more radio-frequency pulses, for example at least one excitation pulse and/or refocusing pulse, as well as a gradient switching set of one or more gradient switchings, which are chronologically coordinated with the radio-frequency pulses. Within the magnetic resonance sequence, the precise parameters of the radio-frequency pulses—i.e. the chronological position and shape—are typically determined exactly. The individual gradient switchings are likewise typically predetermined exactly via defined parameters such as time length, amplitude and/or edge steepness. The magnetic resonance sequence and its imaging parameters typically result from the imaging object that is to be achieved.

A magnetic resonance sequence is typically communicated to a control unit in the form of chronologically successive sequential time intervals (also called event blocks), which control unit then controls (for example) the radio-frequency antenna unit to emit the individual radio-frequency pulses and the gradient coil unit to emit the individual gradient switchings. In the method according to the invention, the communication of the magnetic resonance sequence typically takes place in the form of time intervals to a sequence optimization unit. Each time interval thereby normally characterizes a specific event, for example the emission of a fat saturation pulse, a defined spoiler gradient, a defined repetition within a gradient echo sequence etc. Under the circumstances, the individual events can include multiple radio-frequency (RF) pulses or switched readout windows, as well as gradient switchings that occur at times to match these RF pulses. Typically understood by a switching of a readout window is the activation of a reception device for the magnetic resonance signals—for example of an ADC (analog/digital converter)—that is connected to reception coils of the magnetic resonance apparatus.

Before the execution in the magnetic resonance apparatus, each arriving time of the magnetic resonance sequence is preferably initially analyzed (for example in an analysis unit) to identify first time intervals and second time intervals. The second time intervals of the second time interval set are preferably temporally disjoint from the first time intervals of the first time interval set. The second time intervals—which include a variable time interval—are advantageously initially optimized with regard to their duration before they are transmitted for execution in the magnetic resonance apparatus. The optimization of the duration of a time interval can include a shortening of the duration of the time interval. The optimization of the duration of a time interval can also include a lengthening of the duration of the time interval if the duration of the time interval must be adapted to a shortening of the duration of another time interval (for example due to a predetermined repetition time). The first time intervals are relayed without modification. Only the start time of the first time intervals is adapted, if necessary, so that the first time intervals again are matching, chronologically coordinated again, to the second time intervals optimized in the intervening time period for execution in the magnetic resonance apparatus. A gradient coil unit and/or a radio-frequency antenna control unit can then successively execute the first time intervals and the optimized second time intervals in the matching order. For this, the gradient coil unit and/or the radio-frequency antenna control unit can send the corresponding control commands to a radio-frequency antenna unit and a gradient coil unit so that the entire optimized magnetic resonance sequence is emitted in the correct time order with a time division (timing) that is improved relative to before the optimization.

In a number of magnetic resonance sequences that are often used in clinical magnetic resonance tomography, for example spin echo sequences or turbo spin echo sequences, gradient spoiler pulses (spoilers, for short) are executed in addition to the gradient activations that are necessary for a spatial coding. Gradient spoiler pulses (which are also called gradient crusher switchings, crushers for short, if they occur in pairs) are typically executed immediately before and/or after the coding and readout gradients by the same gradient coils. The gradient spoilers and/or the gradient coil switchings typically ensure that, for example, unwanted magnetic resonance signals, in particular magnetic resonance signals that describe a free induction decay, are suppressed. It is precisely such spoiler gradients and/or crusher gradients that can often be chosen to be very short. Therefore, those time intervals for spoiler and/or crusher gradients are particularly suitable for an optimization of the duration of the time intervals. Those time intervals that have gradient spoiler switchings and/or gradient crusher switchings are then advantageously identified as second time intervals. In a shortening of the duration of the spoiler and/or crusher gradients, the amplitude of the spoiler and/or crusher gradients is typically adapted.

The optimization of the duration of the at least one second time interval in accordance with the invention offers the advantage that the timing of the magnetic resonance sequence can be improved. For example, radio-frequency pulses that serve for a preparation of the magnetization in the measurement region, such as inversion pulses and/or saturation pulses, can thus take place chronologically just before radio-frequency pulses by means of the optimization of the timing, which radio-frequency pulses serve for an excitation of the magnetization in the measurement region. The preparation of the magnetization during the excitation of the magnetization can therefore exist in a more pronounced manner, which leads to an improvement of the image quality of the magnetic resonance image data acquired by means of the optimized magnetic resonance sequence. Furthermore, a time utilization of the magnetic resonance apparatus can be improved and/or optimally utilized during the acquisition of the magnetic resonance sequence. This can lead to a shortening of a measurement time of the magnetic resonance sequence, and thus to an increase of the patient comfort. The power of the gradient system of the magnetic resonance apparatus is simultaneously optimally utilized during the acquisition of the magnetic resonance sequence.

In an embodiment, the automatic optimization of the duration of the at least one second time interval includes a first optimization criterion, namely that the optimized duration of the at least one second time interval is minimized. The optimized duration of the at least one second time interval is minimized under the second optimization criterion (described in the following section) of a compliance with a maximum allowable gradient amplitude and/or a maximum allowable slew rate of gradient switchings. The minimization of the optimized duration offers the advantages described above, for example a shortening of the measurement time of the magnetic resonance sequence.

In another embodiment, the magnetic resonance sequence includes a gradient switching set of one or more gradient switchings, wherein the automatic optimization of the duration of the at least one second time interval includes a second optimization criterion, namely that an adaptation of the gradient switchings of the gradient switching set, which occurs during the at least one second time interval according to the magnetic resonance sequence, to the optimized duration of the at least one time-optimized second time interval is possible, while complying with system specification parameters. According to an embodiment, the system specification parameters include a maximum allowable gradient amplitude and/or a maximum allowable slew rate. The system specification parameters can thus be a maximum allowable gradient amplitude and/or a maximum allowable slew rate for the respective magnetic resonance apparatus. The gradient switchings are typically defined by their gradient amplitude, the duration of the gradient switching and the edge steepness, and by the edge steepness, the first derivative of the form dG/dt of the gradient switching (typically also designated as "slew rate" or slope). The maximum allowable gradient amplitude and slew rate of the gradient switchings which should take place during the at least one second time interval according to the magnetic resonance sequence are advantageously selected, and then the optimized duration of the at least one second time interval is chosen to be as short as possible under these conditions. The adaptation of the gradient switchings that is described in the following is possible while adhering to the adaptation criteria of keeping a gradient switching moment and/or the edge values of the gradient amplitude fixed.

In another embodiment, the magnetic resonance sequence includes a gradient switching set of one or more gradient switchings, wherein an automatic adaptation of the gradient switchings of the gradient switching set, which should take place during the at least one second time interval according to the magnetic resonance sequence to the optimized duration of the at least one time-optimized second time interval, is implemented in an additional method step. The automatic adaptation of the gradient switchings, which gradient switchings should take place during the at least one second time interval according to the magnetic resonance sequence, to the optimized duration of the at least one time-optimized second time interval is typically necessary and/or advantageous since the original (unoptimized) gradient switchings possibly do not chronologically match the shortened time interval and/or are not matched to the optimized duration of the time interval.

In another embodiment, the automatic adaptation of the gradient switchings is implemented under the adaptation criterion of the gradient switching moment being kept constant. The gradient switching moment (also shortened to "moment") is typically defined by the integral of the amplitude of the gradient switching over time, in particular over the duration of the at least one second time interval, and/or as the area under the gradient switching relative to the at least one time interval. In many cases, it is important that the adapted gradient switchings have a defined moment. Depending on whether the gradient switching is positive or negative, the moment can thereby also be correspondingly positive or negative. For example, spoiler gradient switchings or crusher gradient switchings also each have a precisely defined spoiler moment or crusher moment so that they suppress magnetic resonance signals with certainty. Therefore, in the adaptation of the shape of a gradient switching it is preferably ensured that the moment of the gradient switching is kept constant. The described adaptation criteria of the gradient switchings can likewise be used as optimization criteria for a possible optimization of gradient switchings (described below).

In another embodiment, the automatic adaptation of the gradient switchings is implemented under the adaptation criterion that the gradient amplitude of the gradient switchings is kept constant at fixed points, wherein the fixed points include edge values at time interval boundaries of the at least one second time interval at adjoining first time intervals of the first time interval set. Defined fixed points within the at least one second time interval can thereby also be predetermined, for example reaching an amplitude value from zero at a very specific point in time. By keeping the gradient amplitude fixed at fixed points, it is advantageously ensured that there are no jumps (discontinuities) of the gradient amplitudes of the adapted gradient switchings, and the shape of the adapted gradient switching is chosen so that it continuously proceeds across time interval boundaries and/or boundaries between first time intervals and second time intervals. Moreover, care is selected so that the first derivative of the amplitude of the gradient switching at the corresponding limit value of the adjoining first time interval is zero at these boundary values, such that a uniform transition of the gradient amplitude can be achieved without edges. The adaptation criteria that was just described can be used as an optimization criterion given an optimization of gradient switchings that is described below.

In another embodiment, during the automatic analysis of the magnetic resonance sequence, a defined time interval within the magnetic resonance sequence is at least identified as a first time interval when at least one of the following events should take place in the defined time interval according to the magnetic resonance sequence:

Emit a radio-frequency pulse. If a radio-frequency pulse is simultaneously emitted at the same time, it is to be assumed that the parameters—in particular the duration—of the radio-frequency pulse are matched to a desired excitation of the spins in the imaging region. Therefore, a variation of the duration of a time interval with a radio-frequency pulse can typically lead to an adulteration of the sequence. Furthermore, the emission of a radio-frequency pulse to identify a time interval as a first time interval is therefore directly advantageous since simultaneously switched gradient switchings typically belong to the emission of the radio-frequency pulse. The simultaneously switched gradients typically serve for a coding [sic] that the radio-frequency pulse acts on a defined spatial volume. A variation of the duration of the emission of the radio-frequency pulse would lead to a variation of the gradient amplitude, and thus possibly to an adulteration of the magnetic resonance sequence.

Readout raw data, i.e. typically the placement of a readout window and/or readying an ADC to receive. Here the duration of the readout window is also typically established and is advantageously matched to other elements of the magnetic resonance sequence. Therefore, a variation of the duration of a time interval with a readout of raw data typically leads to an adulteration of the sequence. Therefore, a time interval with the readout of raw data is identified as a first time interval, since simultaneously switched gradient switchings typically belong to the readout of the raw data. The simultaneously switched gradient switchings typically serve for a coding of from which spatial region the magnetic resonance signals are received. A variation of the duration of the readout of the raw data would lead to a variation of the gradient amplitude, and thus possibly to an adulteration of the magnetic resonance sequence.

Switch a flow compensation gradient switching. This is typically comprised of two gradient switching moments of different polarity that have the same magnitude. If this gradient switching were modified in its duration, the flow compensation can be destroyed. A variation of the duration of a time interval with a flow compensation gradient switching can therefore typically lead to an adulteration of the sequence.

Switch a diffusion gradient switching. These diffusion gradient switchings also typically serve to apply a defined gradient amplitude over very specific time intervals in order to achieve a defined coding of the signal. Therefore, a variation of the duration of a time interval with a diffusion gradient switching can lead to an adulteration of the sequence.

In another embodiment, the identification of a time interval within the magnetic resonance sequence takes place as a first time interval or as a second time interval by means of at least one of the following methods:

analyze the radio-frequency pulse transmission times,
analyze the readout times, and
analyze the form of the gradient switchings, for example in that these are compared with predetermined pattern shapes for defined gradient switchings that cannot be modified. If a gradient switching corresponds to this pattern shape, this can be an indication that it is such a gradient switching belonging to a first time interval;
analyze identifiers included in a parameter set belonging to a gradient switching, for example names, flags etc. that show that the subsequent gradient switching in the appertaining time interval is a gradient switching whose duration may not be modified. Therefore, the time interval belonging to the gradient switching is typically identified by an analysis unit as a first time interval. Alternatively, the parameters for a rise time, the maximum amplitude to be achieved after a specific time; the duration of a plateau time in which the amplitude is held constant, and a fall time, can also be included in order to completely define the gradient switching. The time interval and/or the time interval parameter set can also include information as to whether the time interval includes a gradient switching that may not be modified. The time interval and/or the time interval parameter set can also include a coding and/or identifier that includes the time interval for a gradient switching, for example a flow compensation gradient switching or a diffusion gradient switching.

Moreover, it is also possible not only for the aforementioned gradient switching types to define the time interval to be associated therewith as a first time interval, but also for additional gradient switchings or gradient switching types to define a first time interval (possibly for a special magnetic resonance sequence) as needed. For this purpose, for example, the analysis unit can accordingly be set in order to identify such defined additional gradient switchings. Corresponding identifiers for these gradient switchings can be placed in the time interval parameter sets, for example. The preferred variants described above show that it is possible with (normally relative simple) means to identify the first time intervals and then to optimize the remaining second time intervals. In particular, such first time intervals in the gradient switchings can be differentiated relatively simply from gradient switchings (for example gradient spoiler switchings) that can be temporally optimized.

In another embodiment, during the automatic analysis of the magnetic resonance sequence, a defined time interval within the magnetic resonance sequence is identified as a first time interval at least when—according to the magnetic resonance sequence—a change of the duration of the defined time interval leads to a change of an echo time and/or a change of a repetition time of the magnetic resonance sequence. The echo time is a measure which characterizes the time that passes between the excitation of a magnetization and a following readout of magnetic resonance signals, in particular at the point in time of a signal maximum. If the magnetic resonance sequence provides a refocusing of a magnetization in a measurement volume by radiation of refocusing pulses, the echo time is a measure that characterizes double the time which passes between an excitation of the magnetization by radiation of excitation pulses and a refocusing of the magnetization by means of the refocusing pulses. The repetition time is a measure that characterizes a time which passes between two excitation pulses of the magnetic resonance sequence. Depending on settings of the magnetic resonance sequence and/or specifications by a user (described below), a fixed echo time and/or repetition time can be predetermined in a magnetic resonance sequence. For example, a shortening of the duration of the time interval between an excitation of the magnetization in the measurement region and a readout of the magnetic resonance signals from the measurement region can require a change of the echo time, and thus adulterate the image data acquired by means of the magnetic resonance sequence. Therefore, the criterion of keeping the echo time and/or repetition time fixed to identify a time interval as a first time interval is advantageous.

In another embodiment, the magnetic resonance apparatus has an input unit, and the optimization of the magnetic resonance sequence is implemented depending on an input by a user via the input unit. For example, the user can then activate a selection field (a check box) via the input unit after the selection of the magnetic resonance sequence. The activation of the selection field will then typically lead to the situation that an automatic optimization of the duration of the second time intervals of the magnetic resonance sequence is implemented by a sequence optimization unit. The user thus has the possibility to decide when he or she wants an optimization of the duration of the second time intervals. This is typically the case when the user is willing to accept a slight increase of the noise volume of the magnetic resonance apparatus in order to enable an improved utilization of the gradient power during the acquisition of magnetic resonance images by the optimized magnetic resonance sequence and/or a shortening of the measurement time. The changes to the magnetic resonance sequence that are caused by the optimization of the magnetic resonance sequence can be suggested to the user for confirmation. The user can predetermine a fixed echo time and/or repetition time for the magnetic resonance sequence. The user can also select a minimum echo time mode and/or a minimum repetition time mode in which the duration of the at least one second time interval is then minimized such that the magnetic resonance sequence has a minimum echo time and/or repetition time. Depending on the mode selected by the user, different criteria can also exist for the identification of a time interval as a first or second time interval. For example, in the minimum echo time mode a time interval is also typically identified as a second time interval when—according to the magnetic resonance sequence—a change of the duration of the defined time interval leads to a shortening of an echo time of the magnetic resonance sequence. Depending on the selected mode of the user, different optimization criteria can also exist for the optimization of the at least one second time interval.

In another embodiment, the magnetic resonance sequence includes a gradient switching set of one or more gradient switchings, wherein an automatic optimization of at least one gradient switching of the gradient switching set takes place.

An optimization of the duration of at least one second time interval preferably takes place first, and following this, an adaptation of the gradient switchings during the at least one second time interval to the optimized duration of the at least one second time interval takes place. Thereafter, an optimization of at least one gradient switching of the gradient switching set takes place. A different time order of the optimizations and/or adaptation is also possible. The optimization of the duration of the at least one second time interval and the optimization of the at least one gradient switching of the gradient switching set can thereby take place independently of one another. In particular, the optimization of the duration and the gradient switchings can take place in different time intervals of the magnetic resonance sequence. Naturally, the automatic optimization of at least one gradient switching of the gradient switching set is thereby optional. A method according to the invention can also include only an automatic optimization of the duration of at least one second time interval of the second time interval set, and no optimization of at least one gradient switching of the gradient switching set.

The optimization of at least one gradient switching of the gradient switching set is based on the recognition that switching between respective gradient coils of the gradient coil unit, via which the gradient activations are emitted, occur often and rapidly during a magnetic resonance sequence. Since the time specifications within a magnetic resonance sequence are for the most part very strict, and additionally the total duration of a magnetic resonance sequence (which determines the total duration of a magnetic resonance examination) must be kept as short as possible, gradient strengths around 40 mT/m and slew rates of up to 200 mT/m/ms must be achieved in part. In particular, such a high edge steepness contributes to the known noise development during the switching of the gradients. Eddy currents with different components of the magnetic resonance apparatus—in particular the radio-frequency shield—are one reason for this noise development. In addition, steep edges of the gradients lead to a higher power consumption and additionally place high demands on the gradient coils and the additional hardware. The rapidly changing gradient fields lead to distortions and oscillations in the gradient coils and to transfer these energies to the housing. A high helium boil-off can additionally occur due to heating of the coils and the additional components.

If an optimization of at least one gradient switching of the gradient switching set is implemented, an automatic analysis of the magnetic resonance sequence in order to identify fixed point time intervals in the magnetic resonance sequence that are left unmodified with regard to the optimization of the gradient switchings, and in order to identify modifiable time intervals in the magnetic resonance sequence that might be optimized with regard to the gradient switchings, also takes place for the optimization of the gradient switching as for the optimization of the duration. Fixed point time intervals are individual points in time or time intervals in which the current amplitudes of the gradient switchings must be fixed without being modifiable so that the gradients can further satisfy their proper function. For example, numbering among these are slice selection gradients or gradients during the readout window that serve to achieve a defined coding at a defined point in time. In particular, the fixed point time intervals are a subset of the aforementioned first time intervals. During the automatic analysis of the magnetic resonance sequence, a defined time interval within the magnetic resonance sequence is advantageously identified as a fixed point time interval at least when—according to the magnetic resonance sequence—at least one of the following events should take place in a defined time interval:

emit a radio-frequency pulse,
emit raw data,
switch a flow compensation gradient switching,
switch a diffusion gradient switching, and
switch a knock gradient switching.

In addition to these unmodifiable individual points or time intervals at which a defined gradient must have a very specific value, there are typically modifiable time intervals situated in between these points. Arranged wholly or partially within these are typically gradient switchings that, although they also satisfy a specific function, do not depend on the time specifications being precisely complied with and/or on a defined amplitude being present at a very exact point in time. It often merely depends on a predetermined amplitude being achieved up to a defined point in time; on a predetermined amplitude being ramped down as of a defined point in time; or at least a defined moment being achieved within a broader time interval. In these modifiable time intervals, the gradient switching shapes can in principle be modified while heeding defined boundary conditions, for example keeping the gradient switching moment and/or the gradient amplitude fixed at edge values of the modifiable time intervals so that these time intervals are available for an optimization. In particular, the second time intervals are a subset of the modifiable time intervals since additional criteria—for example the prevention of a change to an echo time and/or repetition time—can apply to the second time intervals, for example.

The automatic optimization of gradient switchings in the modifiable time intervals typically takes place according to a predetermined optimization criterion. In principle, an arbitrary optimization criterion can thereby be predetermined. For example, in a variant within the scope of the invention, an optimization can take place to the effect that the coding via the gradient switchings takes place as quickly as possible in order (for example) to minimize flow artifacts due to moving substances (blood flow, for example).

In a further variant, for example, an optimization takes place for noise reduction. For this, the first derivation of a shape of the gradient switchings can particularly preferably be optimized automatically in the modifiable time intervals. For example, the gradient curve in the second time intervals is optimized so that—under defined boundary conditions—an optimally low slew rate is adhered to because this leads to particularly loud noises. In other words: the optimization step takes place with regard to an optimally significant noise reduction in that the gradient switching shape is optimized with regard to the minimization of the first derivative of the function which predetermines the shape. However, amplitudes of the gradient switchings can thereby also be additionally minimized. The gradient curve is then particularly preferably smoothed in the optimization since a particularly good noise reduction is achieved in this manner.

Given the optimization of multiple successive gradient switchings, within a modifiable time interval gradient switchings are especially preferably assembled into a common, contiguous gradient switching. A particular advantage is thereby achieved relative to the unoptimized gradient switchings in that the gradient amplitude is just not unnecessarily reduced to a value of zero only to subsequently increase again with a correspondingly steep edge in order to form the next gradient switching.

The shapes in the individual gradient directions are thereby advantageously respectively optimized separately, meaning that the shape and/or the gradient curve are considered and optimized separately in each gradient direction (for example x-, y-, z-direction and/or slice selection direction, phase coding direction and readout direction). It has turned out to be particularly effective to use what is known as a spline interpolation method. A method of the fourth order is especially preferably used. In a spline interpolation, given node points (for example the fixed points in the present case) are typically interpolated with the use of polynomials that are continuous in portions thereof (known as splines).

The following advantages typically result from the optimization of the gradient switchings: for example, if an optimization with regard to the first derivative of the shape and/or a merging of multiple gradient switchings takes place, a marked reduction of the slew rate that is used is achieved, and therefore a lesser stressing of the gradient system is achieved. A lower power consumption, a reduced heating of the gradient coils and therefore also a reduced helium boil off are therefore incurred. Furthermore, new possibilities for creation of more cost-effective gradient coils advantageously result from these. Moreover, a markedly lower noise development is typically achieved during the examination.

In another embodiment, the magnetic resonance sequence has a gradient switching set composed of one or more gradient switchings, wherein at the termination of an optimization and/or adaptation of at least one gradient switching of the gradient switching set the at least one optimized and/or adapted gradient switching is checked for compliance with system specification parameters. System specification parameters preferably again include a maximum allowable gradient amplitude and/or a maximum allowable slew rate. Independent of how the optimization and/or adaptation of the gradient switching takes place, at the termination of the optimization and/or adaptation of the gradient switching the at least one gradient switching can preferably be checked for the compliance with the specific system specification parameters. Each gradient switching of the gradient switching set can also be checked. If the system specification parameters are not complied with for any reasons—for example if the maximum allowable gradient amplitude and/or the maximum allowable slew rate are exceeded, the optimized and/or adapted gradient switching is typically not used. In this case, the optimized and/or adapted gradient switching is preferably replaced again in the time interval by the original gradient switching, and/or the optimized duration of the time interval is again set back to the original duration.

In the method according to the invention for operation of a magnetic resonance apparatus, a magnetic resonance sequence is initially optimized in a method according to the invention for optimization of a magnetic resonance sequence, and then the magnetic resonance apparatus is operated using the optimized magnetic resonance sequence. During the measurement—i.e. if a patient lies in a patient accommodation region of the system—with appropriately selected optimization criterion an improved utilization of the gradient power and/or a shortened measurement duration can then occur. The optimization can be implemented online in or directly before the execution of the magnetic resonance sequence.

The sequence optimization unit according to the invention for the optimization of a magnetic resonance sequence of a magnetic resonance apparatus has a computer designed to execute a method according to the invention. The sequence optimization unit is thus designed to execute a method to optimize a magnetic resonance sequence of a magnetic resonance apparatus.

For this purpose, the sequence optimization unit includes an input interface designed to implement an adoption of a magnetic resonance sequence, wherein the magnetic resonance sequence includes a time interval set of one or more first time intervals and a second time interval set of one or more second time intervals, wherein the first time intervals of the first time interval set are to be left unmodified with regard to an optimization of the duration.

Furthermore, the sequence optimization unit includes an analysis unit designed to implement an automatic analysis of the magnetic resonance sequence to identify the first time intervals of the first time interval set and the second time intervals of the second time interval set in the magnetic resonance sequence.

Furthermore, the sequence optimization unit comprises a duration optimization unit designed to implement an automatic optimization of the duration of at least a second time interval of the second time interval set.

Embodiments of the sequence optimization unit according to the invention are designed analogous to the embodiments of the method according to the invention. The optimization of the magnetic resonance sequence by means of the sequence optimization unit according to the invention can lead to an improved utilized of the gradient power and/or a shortened measurement duration. The sequence optimization unit can have additional control components which are necessary and/or advantageous for execution of a method according to the invention. The sequence optimization unit can also be designed to send control signals to a magnetic resonance apparatus and/or to receive and/or prepare control signals in order to execute a method according to the invention. The sequence optimization unit is preferably part of the control unit of the magnetic resonance apparatus and preferably is relatively closely upstream of the radio-frequency antenna unit and/or the gradient coil unit. Computer programs and additional software can be stored on a memory unit of the sequence optimization unit, by means of which computer programs and additional software a processor of the sequence optimization unit automatically controls and/or executes a method workflow of a method according to the invention.

The magnetic resonance apparatus according to the invention has a sequence optimization unit. Therefore, the magnetic resonance apparatus is designed to execute a method according to the invention with the sequence optimization unit. The sequence optimization unit can be integrated into the magnetic resonance apparatus. The sequence optimization unit can also be installed separate from the magnetic resonance apparatus. The sequence optimization unit can be connected with the magnetic resonance apparatus. The optimization of the magnetic resonance sequence by the magnetic resonance apparatus according to the invention can lead to an improved utilization of the gradient power and/or a shortened measurement duration.

A non-transitory, computer-readable storage medium according to the invention can be loaded directly into a memory of a programmable computer of a magnetic resonance apparatus, and has program code in order to execute a method according to the invention if the computer program product is executed in the computer of said magnetic resonance apparatus. The method according to the invention can thereby be executed quickly, robustly and so as to be identically repeatable. The program code is configured to cause the computer to execute the method steps according to the invention. The computer must thereby have the requirements (for example a working memory, a graphics card or a logic unit) so that the method steps can be executed efficiently. Examples of such an electronically readable data medium are a DVD, a magnetic tape or a USB stick on which is stored electronically readable control information, in particular software (see above). All embodiments according to the invention of the method described in the preceding can be implemented when this control information (software) is read from the data medium and stored in a controller and/or computer of a magnetic resonance apparatus.

DESCRIPTION OF THE PREFERRED EMBODIMENTS

Figure 1:
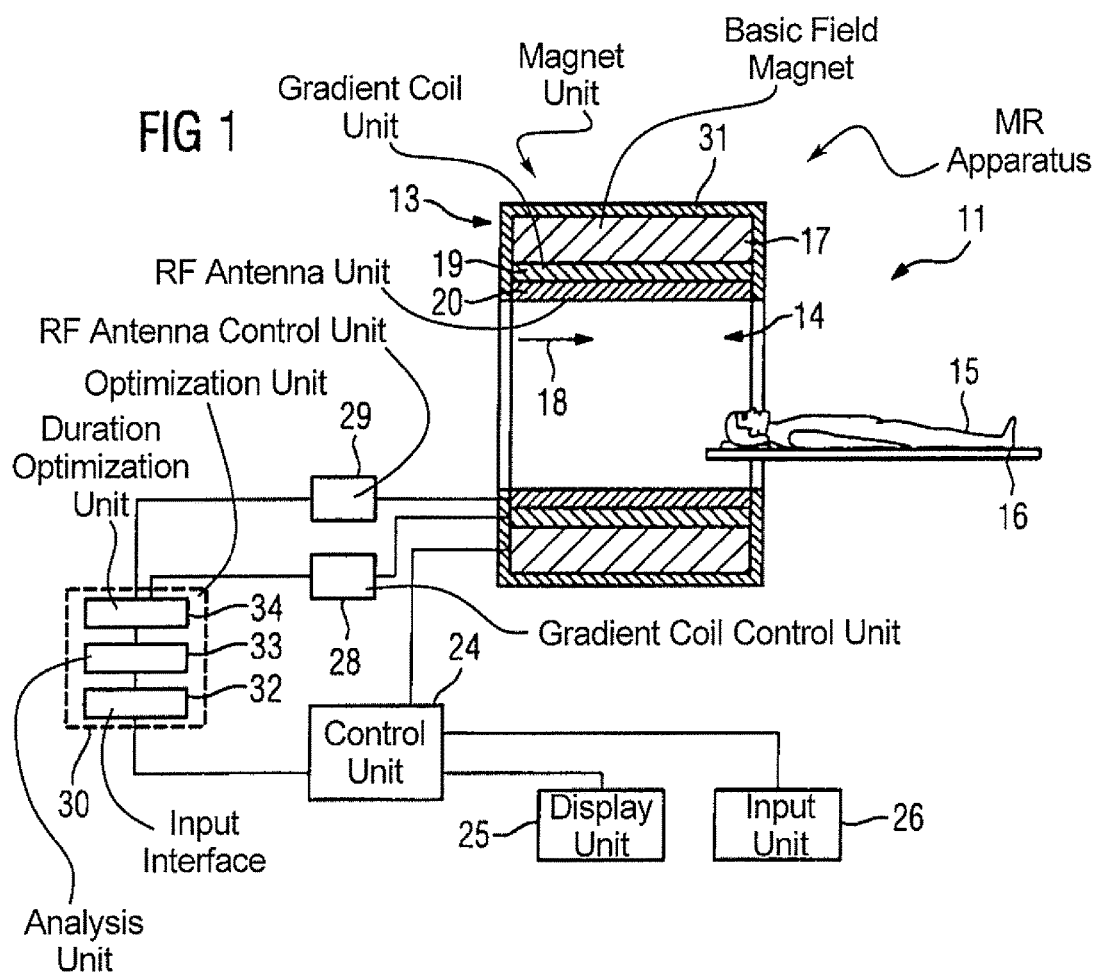
FIG. 1 shows a magnetic resonance apparatus according to the invention for execution of a method according to the invention, in a schematic presentation.

FIG. 1 shows, in a schematic presentation, a magnetic resonance apparatus 11 according to the invention for execution of a method according to the invention. The magnetic resonance apparatus 11 has a data acquisition unit (formed by a magnet unit 13) with a basic field magnet 17 to generate a strong and constant basic magnetic field 18. In addition, the magnetic resonance apparatus 11 has a cylindrical patient acquisition region 14 for an acquisition of a patient 15, wherein the patient acquisition region 14 is cylindrically enclosed by the magnet unit 13 in a circumferential direction. The patient 15 can be slid into the patient acquisition region 14 by a patient support device 16 of the magnetic resonance apparatus 11. For this purpose, the patient bearing device 16 has a patient table that is arranged so as to be movable within the magnetic resonance apparatus 11. The magnet unit 13 is externally shielded by a housing casing 31 of the magnetic resonance apparatus.

Furthermore, the magnet unit 13 has a gradient coil unit 19 to generate magnetic field gradients that are used for a spatial coding during an imaging. The gradient coil unit 19 is controlled by means of a gradient control unit 28. The magnetic field gradients are generated in the x-, y- and z-directions. The gradient coils of the gradient coil unit 19 can be controlled independently of one another in the x-, y- and z-directions so that, with a predetermined combination, gradients can be applied in arbitrary spatial directions (for example in the slice selection direction, in the phase coding direction or in the readout direction), wherein these directions normally depend on the chosen slice orientation. The spatial directions of the gradient switchings can likewise also coincide with the x-, y- and z-directions; for example, the slice selection direction points in the z-direction, the phase coding direction points in the y-direction and the readout direction points in the x-direction. The x-direction is that direction situated horizontally orthogonal to the direction of the basic magnetic field 18 (the z-direction). The y-direction is that direction situated vertically orthogonal to the z-direction, and orthogonal to the x-direction.

Furthermore, the magnet unit 13 has a radio-frequency antenna unit 20 (which, in the shown case, is designed as a body coil permanently integrated into the magnetic resonance apparatus 10) and a radio-frequency antenna control unit 29 for an excitation of a polarization that arises in the basic magnetic field 18 generated by the basic magnet 17. The radio-frequency antenna unit 20 is controlled by the radio-frequency antenna control unit 29 and radiates high-frequency radio-frequency pulses into an examination space that is essentially formed by the patient acquisition region 14.

The magnetic resonance apparatus 11 has a control unit 24 to control the basic magnet 17, the gradient control unit 28 and the radio-frequency antenna control unit 29. The control unit 24 centrally controls the magnetic resonance apparatus 11, for example the implementation of magnetic resonance sequences. Control information (for example imaging parameters) and reconstructed magnetic resonance images can be displayed for a user at a display unit 25 (for example on at least one monitor) of the magnetic resonance apparatus 11. In addition, the magnetic resonance apparatus 11 has an input unit 26 via which information and/or imaging parameters can be entered by a user during a measurement process. The control unit 24 can include the gradient control unit 28 and/or radio-frequency antenna control unit 29 and/or the display unit 25 and/or the input unit 26. The magnetic resonance apparatus furthermore has a sequence optimization unit 30 which has a computer (not shown further) for optimization of imaging parameters of magnetic resonance sequences. In addition, the sequence optimization unit 30 furthermore comprises an input interface 32, an analysis unit 33 and a duration optimization unit 34.

The shown magnetic resonance apparatus 11 can naturally have additional components that magnetic resonance apparatuses 11 conventionally have. A general functionality of a magnetic resonance apparatus 11 is additionally known to those skilled in the art, such that a detailed description of the additional components is not necessary herein.

Figure 2:
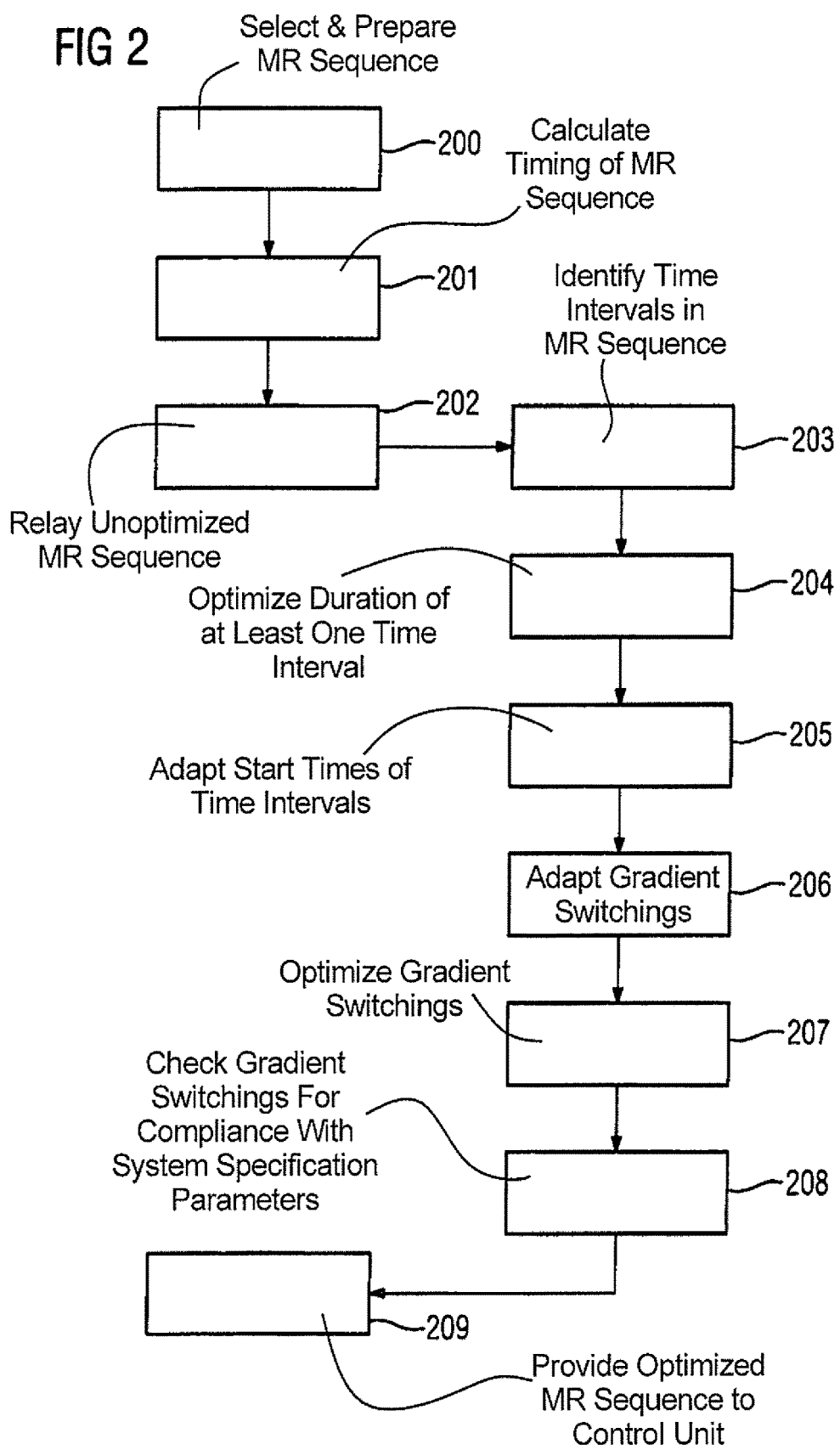
FIG. 2 is a flowchart of an embodiment of a method according to the invention.

FIG. 2 is a flowchart of an embodiment of a method according to the invention. In a first method step 200, a selection and preparation of the magnetic resonance sequence is initially implemented in a typical manner. This means that, via the input unit 26, a user typically establishes the type of magnetic resonance sequence and/or searches for a corresponding protocol in which a specific magnetic resonance sequence is defined. The protocols thereby include various imaging parameters for the respective magnetic resonance sequence. Among these imaging parameters are specific ground rules for the desired magnetic resonance sequence, for example the type of magnetic resonance sequence, i.e. whether it is a spin echo sequence, a turbo spin echo sequence etc. Furthermore, counting amount these are the imaging parameters of: slice thickness; slice intervals; number of slices; resolution; repetition times; the echo times in a spin echo sequence; whether the magnetic resonance sequence should be executed with a minimum echo time and/or a minimum repetition time etc. With the use of the input unit 26, the user can modify a portion of these imaging parameters in order to create an individual magnetic resonance sequence for a currently desired measurement. For this, modifiable imaging parameters are offered to the user for modification, for example at a graphical user interface of the input unit 26.

In a further method step 201, the precise timing and the workflow of the magnetic resonance sequence are then calculated with the predetermined defined imaging parameters. The magnetic resonance sequence can be calculated in the control unit 24 that, for example, can be realized in the form of software components in a computer system of the magnetic resonance apparatus 11.

In a further method step 202, the relaying of the magnetic resonance sequence that is ready for transmission but not yet optimized takes place in the form of time intervals (also called event blocks). A direct relaying of the time intervals to the gradient control unit 28 and the radio-frequency antenna control unit 29 does not take place. Rather, in a further method step 202 the magnetic resonance sequence is initially relayed from the control unit 24 to the sequence optimization unit 30 for optimization of the magnetic resonance sequence before being relayed to the gradient control unit 28 and the radio-frequency antenna control unit 29. The input interface 32 of the sequence optimization unit 30 is designed to accept the magnetic resonance sequence that is actually finished, ready for transmission, but is to be optimized.

In a further method step 203, the analysis unit 33 of the sequence optimization unit 30 analyzes the magnetic resonance sequence and thereby identifies first time intervals and second time intervals of the magnetic resonance sequence. This is depicted as an example in the transition from FIG. 3 to FIG. 4. The first time intervals are thereby to be left unmodified relative to an optimization of the duration. The durations of the second time intervals may be optimized. In particular, during the automatic analysis of the magnetic resonance sequence a defined time interval within the magnetic resonance sequence is identified as a first time interval by then analysis unit 33 at least when—according to the magnetic resonance sequence—at least one of the following events should take place in the defined time interval:

emission of a radio-frequency pulse,
readout of raw data,
switching of a flow compensation gradient switching, and
switching of a diffusion gradient switching.

For this, to identify a time interval within the magnetic resonance sequence as a first time interval or as a second time interval, the analysis unit 33 uses at least one of the following methods:

analysis of the radio-frequency pulse transmission times,
analysis of the readout times,
analysis of the shape of the gradient switchings, and
analysis of the identifiers included in a parameter set belonging to a gradient switching.

Furthermore, during the automatic analysis of the magnetic resonance sequence a defined time interval within the magnetic resonance sequence is identified by the analysis unit 33 as a first time interval at least when—according to the magnetic resonance sequence—a change of the duration of the defined time interval leads to a change of an echo time and/or a change of a repetition time of the magnetic resonance sequence.

In a further method step 204, an optimization of the duration of at least one time interval takes place by means of the duration optimization unit 34 of the sequence optimization unit 30. In particular, the optimization of the duration of the at least one second time interval takes place under the optimization criterion that the duration of the at least one second time interval is minimized. Furthermore, the automatic optimization of the duration of the at least one second time interval takes place under the optimization criterion that an adaptation of the gradient switchings which—according to the magnetic resonance sequence—should take place during the at least one second time interval to the optimized duration of the at least one time-optimized second time interval is possible while complying with system specification parameters, in particular a maximum allowable gradient amplitude and/or a maximum allowable slew rate. Various optimization criteria and the associated rules can be stored in a memory. These optimization criteria can optionally be offered to the user for selection on a monitor of the display unit 25, wherein the user then implements the selection via the input unit 26.

In a further method step 205, if necessary the start times of the first and second time intervals are adapted to the modified duration of the at least one time interval by the sequence optimization unit 30.

In a further method step 206, an automatic adaptation of the gradient switchings of the gradient switching set which—according to the magnetic resonance sequence—should take place during the at least one second time interval to the optimized duration of the at least one time-optimized second time interval is implemented by the sequence optimization unit 30. This is implemented under the adaptation criteria that the gradient switching moment is kept constant, and that the amplitude of the gradient switchings is kept constant at fixed points, wherein the fixed points include edge values at time interval boundaries of the at least one second time interval with adjoining first time intervals. Method steps 204, 205 and 206 are shown as examples in the transition from FIG. 4 to FIG. 5.

In a further method step 207, an automatic optimization of at least one gradient switching of the gradient switching set takes place. The additional method step 207 is hereby optional and can also take place before the additional method step 204, for example. The example optimization of at least one gradient switching is shown in the transition from FIG. 6 to FIG. 3.

In a further method step 208, after an optimization and/or adaptation of at least one gradient switching of the gradient switching set the at least one optimized and/or adapted gradient switching is checked for compliance with system specification parameters, in particular the compliance with a maximum allowable gradient amplitude and/or a maximum allowable slew rate. The maximum allowable gradient amplitude and/or maximum allowable slew rate are system specification parameters which can be stored in a memory, for example. Additional system specification parameters can also be used to check the at least one optimized and/or adapted gradient switching.

In a further method step 209, the optimized magnetic resonance sequence (with the optimized at least one second time interval, the adapted gradient switchings, the possibly optimized gradient switchings and the additional first and second time intervals which are possibly adapted in their start time) is finally passed to the gradient control unit 28 and the radio-frequency antenna control unit 29. From the optimized magnetic resonance sequence, the gradient coil unit 28 and the radio-frequency antenna control unit 29 generate the corresponding control commands and pass these to the radio-frequency antenna unit 20 and the gradient coil unit 19 so that the entire optimized magnetic resonance sequence is executed in the correct chronological order, with a timing that is improved relative to before the optimization, for acquisition of magnetic resonance image data by means of the magnetic resonance apparatus 11.

The method steps of the method according to the invention that are shown in FIG. 2 are executed by the sequence optimization unit 30 together with the magnetic resonance apparatus 11. For this, the sequence optimization unit 30 comprises corresponding software and/or computer programs that are stored in a memory unit of the sequence optimization unit 30. The software and/or computer programs include code designed to cause the method according to the invention to be executed when the computer program and/or software is executed in said sequence optimization unit 30 by a processor unit of the magnetic resonance apparatus 11.

Figure 3:
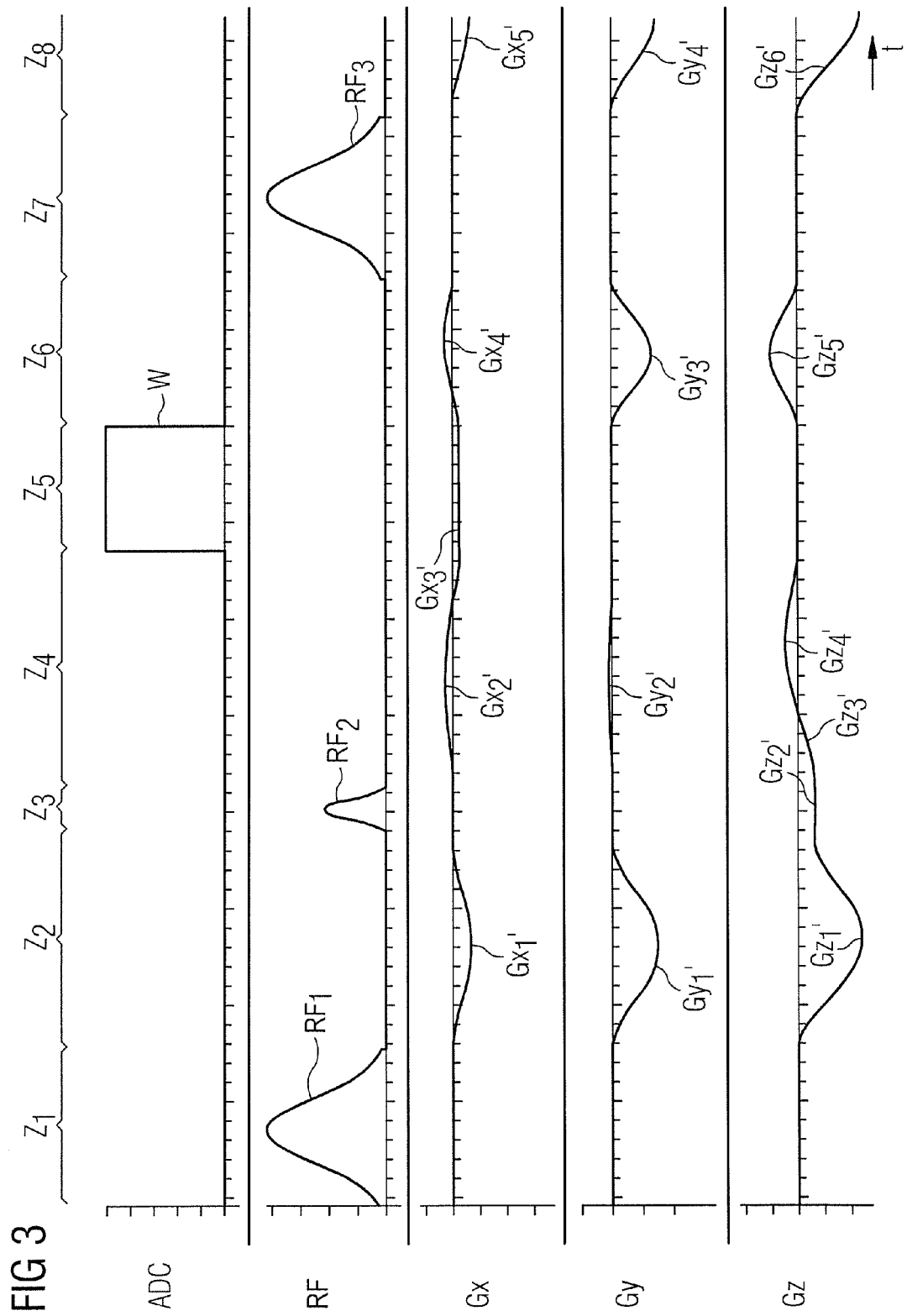
FIG. 3 is a sequence diagram of a magnetic resonance sequence to be optimized in its chronological workflow according to the method according to the invention.

As an example, FIG. 3 shows a sequence diagram of a portion of a very simplified magnetic resonance sequence (a gradient echo sequence) that is subdivided into time intervals $Z_1, Z_2, Z_3, \ldots, Z_8$ (in FIG. 3, only the first seven time intervals are shown entirely, and the eighth is shown nearly entirely). In this sequence diagram, the readout window W, the radio-frequency pulses $RF_1$, $RF_2$, $RF_3$ and the gradient switchings are respectively shown depending on the time t in a typical manner on different time axes situated one over another. The readout window W is thereby shown on the uppermost readout time axis ADC. The amplitudes of the radio-frequency pulses $RF_1$, $RF_2$, $RF_3$ are shown on the second-uppermost radio-frequency pulse time axis RF. The gradient switchings $Gx_{1'}$, $Gx_{2'}$, $Gx_{3'}$, $Gx_{4'}$, $Gx_{5'}$ are shown un the underlying gradient switching time axis Gx. These are the gradient switchings in the readout direction. On the second-lowermost gradient switching time axis Gy, the gradient switchings $Gy_{1'}$, $Gy_{2'}$, $Gy_{3'}$, $Gy_{4'}$ are shown which are switched in the phase coding direction. The gradient switchings $Gz_{1'}$, $Gz_{2'}$, $Gz_{3'}$, $Gz_{4'}$, $Gz_{5'}$, $Gz_{6'}$ in the slice selection direction are shown on the lowermost gradient switching time axis Gz. The position of the time axis respectively indicates the zero line, meaning that the gradient switchings can have negative or positive amplitudes in the gradients depending on whether their amplitudes extend downward or upward from the gradient switching time axis Gx, Gy, Gz. In all sequence diagrams, for simplification the scaling in the time direction and in amplitude directions takes place only in arbitrary units.

The first time interval $Z_1$ and second time interval $Z_2$ of this magnetic resonance sequence should induce a fat saturation. Therefore, a relatively strong radio-frequency pulse $RF_1$ is initially emitted in a first time interval $Z_1$, during which radio-frequency pulse $RF_1$ no gradient switching is executed so that the radio-frequency pulse $RF_1$ does not act slice-selectively. Immediately after the end of this radio-frequency pulse $RF_1$, three gradient switchings $Gx_{1'}$, $Gy_{1'}$, $Gz_{1'}$ follow in all three spatial axes in the following time interval $Z_2$, which gradient switchings $Gx_{1'}$, $Gy_{1'}$, $Gz_{1'}$ serve to dephase an unwanted transversal magnetization that is generated by the fat saturation. The gradient switchings $Gx_{1'}$, $Gy_{1'}$, $Gz_{1'}$ simultaneously serve as pre-spoilers in $Z_2$. These pre-spoilers also serve to effectively dephase transversal residual magnetization that is possibly present.

The third time interval $Z_3$, fourth time interval $Z_4$ and fifth time interval $Z_5$ form a gradient echo sequence in which magnetic resonance signals are acquired in a defined volume or a defined slice. In $Z_3$, the volume is thereby excited via a radio-frequency pulse $RF_2$ with simultaneous execution of a defined gradient $Gz_{2'}$ in a slice selection direction Gz, and in $Z_5$ a readout window W is placed while switching a defined gradient $Gx_{3'}$ in the readout direction, which means that the ADC is switched to receive. In $Z_4$ there are additional gradient switchings $Gx_{2'}$, $Gy_{2'}$, $Gz_{3'}$, $Gz_{4'}$ which serve to dephase transversal magnetization generated by the excitation pulse in order to not generate unwanted echoes in the following time intervals.

A sixth time interval $Z_6$ then follows these gradient echo time intervals, during which sixth time interval $Z_6$ three gradient switchings $Gx_{4'}$, $Gy_{3'}$, $Gz_{5'}$ are switched in parallel in the x-, y- and z-direction, which gradient switchings $Gx_{4'}$, $Gy_{3'}$, $Gz_{5'}$ serve as spoiler gradients for dephasing of the magnetization.

The acquisition cycle subsequently begins again from the start in that a radio-frequency pulse $RF_3$ that is not slice-selective is emitted in a seventh time interval $Z_7$, wherein all gradients are set to zero and additional gradient switchings $Gx_{5'}$, $Gy_{4'}$, $Gz_{6'}$ are subsequently emitted again in all three spatial directions in the eighth time interval $Z_8$. Additional time intervals can then subsequently follow, for example a new pre-spoiler, an additional repetition, a gradient echo time interval etc.

Some of these time intervals $Z_1, Z_2, Z_3, \ldots, Z_8$ can be optimized with regard to their duration, and thus second time intervals $I_2$. Here these are the time intervals that do not fall under the criteria described above that identify a time interval as not a first time interval $I_1$ that can be optimized in the duration. $Z_1$, $Z_3$ and $Z_7$ are thus first time intervals $I_1$ since radio-frequency pulses $RF_1$, $RF_2$, $RF_3$ are emitted during them. $Z_5$ is likewise a first time interval $I_1$ since a readout window W is switched during $Z_5$. In the shown case, it has been predetermined by the user that the echo time should be kept constant while a change of the repetition time is allowed due to an optimization of the second time intervals $I_2$. $Z_4$ is thus a first time interval $I_1$ since a change of the duration of $Z_4$ would lead to a change of the echo time, the time between the radio-frequency pulse $RF_2$ and the center of the readout window W. In the simplified sequence that is shown here, specific gradient switchings such as flow compensation gradient switchings or diffusion gradient switchings are not included and thus cannot be used as criteria to identify a time interval as a first time interval $I_1$. Time intervals $Z_2$, $Z_6$ and $Z_8$ are optimizable with regard to the duration and thus are to be identified as second time intervals $I_2$. This is based on the fact that none of the cited criteria apply to the time intervals $Z_2$, $Z_6$ and $Z_8$, and a change of the duration of $Z_2$, $Z_6$ and $Z_8$ would keep the echo time constant. In particular, time interval $Z_6$ is identified as a second time interval $I_2$ since $Z_6$ includes a spoiler gradient.

Figure 4:
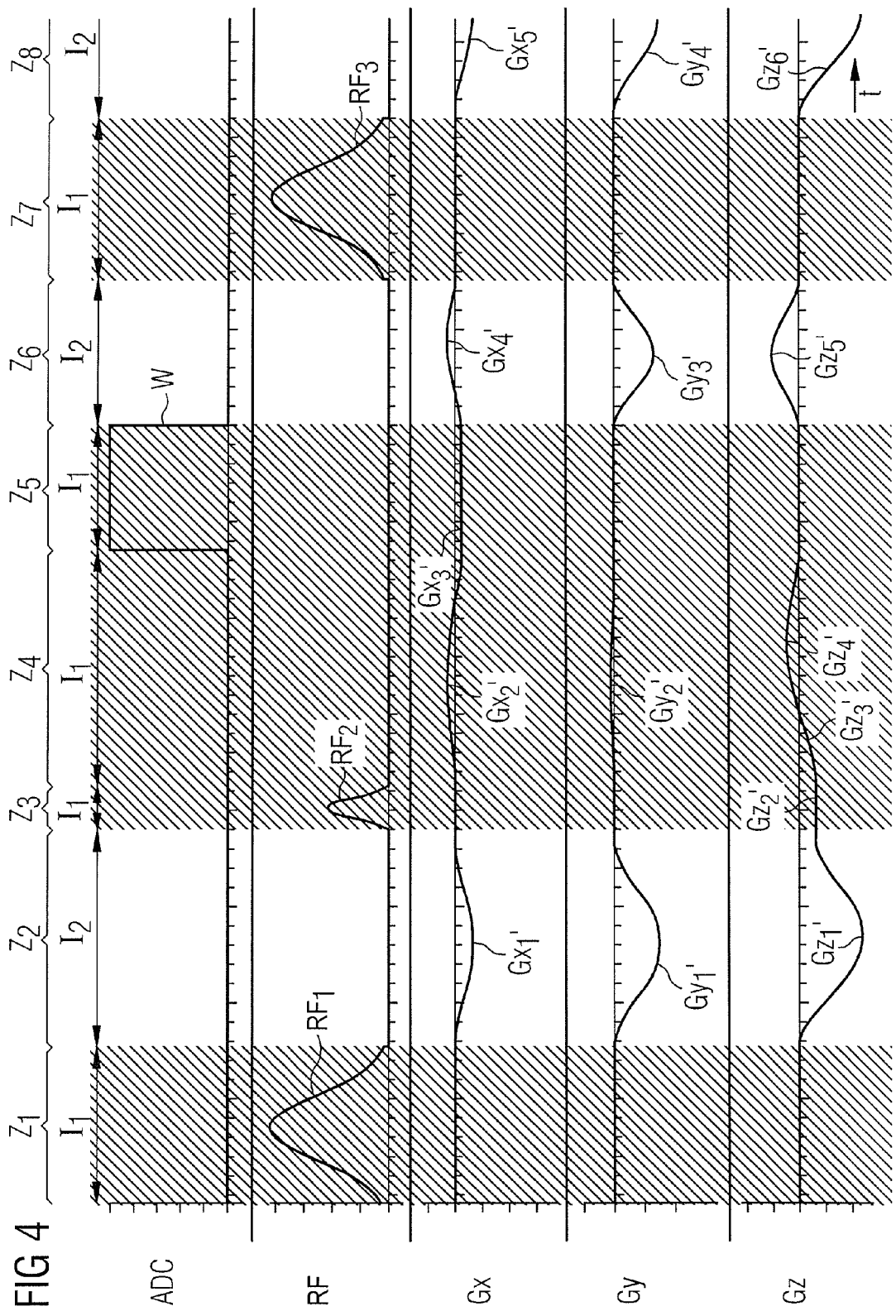
FIG. 4 shows the sequence diagram according to FIG. 3, subdivided into first and second time intervals.

FIG. 4 shows the sequence diagram of the magnetic resonance sequence from FIG. 3. Here the first time intervals $I_1$ that have been determined (by the analysis unit 33) to not be optimizable in the further method step 203 are respectively covered by a cross-striped pattern. The optimizable second time intervals $I_2$ are not covered by a cross-striped pattern. The optimizable second time intervals $I_2$ are not covered by a cross-striped pattern.

Figure 5:
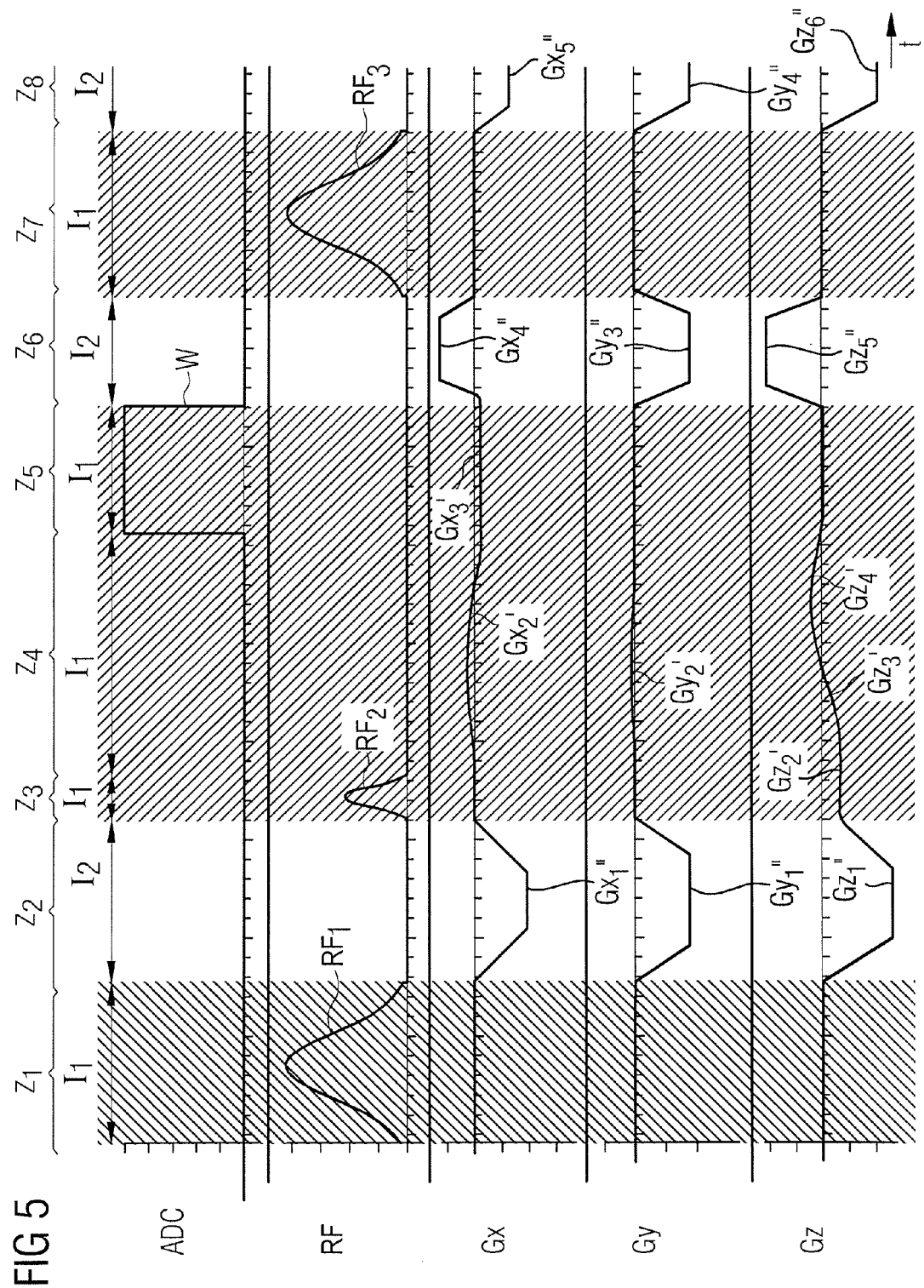
FIG. 5 shows the sequence diagram according to FIG. 4 after optimization of the duration of the second time intervals.

FIG. 5 shows the sequence diagram of the magnetic resonance sequence from FIG. 3 and FIG. 4. The duration of the second time intervals $Z_2$, $Z_4$ and $Z_6$ was hereby optimized. The duration of the second time intervals $I_2$ was minimized under the optimization criteria of a maximum allowable gradient amplitude and slew rate of the gradient switchings, while the optimizable second time intervals $I_2$ are minimized by means of the duration optimization unit 34 in the further method step 204.

In a further method step 206, the gradient switchings $Gx_{1''}$, $Gy_{1'}$ and $Gz_{1'}$ were simultaneously adapted due to the shortened duration of the time interval $Z_2$, whereby new gradient switchings $Gx_{1''}$, $Gy_{1''}$ and $Gz_{1''}$ are created. The amplitude values of the gradient switchings at the boundaries at $Z_1$ and $Z_3$ have respectively been held constant as fixed points. Furthermore, the adaptation of the gradient switchings has been implemented such that the gradient switching moment of the gradient switchings in $Z_2$ is the same before and after the optimization. The gradient switchings $Gx_{4'}$, $Gy_{3'}$ and $Gz_{5'}$ were similarly adapted to adapted gradient switchings $Gx_{4''}$, $Gy_{3''}$ and $Gz_{5''}$ due to the shortened duration of $Z_6$. Similarly, the gradient switchings $Gx_{5'}$, $Gy_{4'}$ and $Gz_{6'}$ were similarly adapted to adapted gradient switchings $Gx_{5''}$, $Gy_{4''}$ and $Gz_{6''}$ due to the shortened duration of $Z_8$.

As was shown in FIG. 5, by the optimization of the duration of the second time intervals $I_2$ it has been achieved that the excitation pulse $RF_2$ was shifted closer to the saturation pulse $RF_1$, whereby the effect of the saturation pulse $RF_1$ was improved in the excitation of the magnetization. Furthermore, the duration of the spoiler gradient in $Z_6$ can be shortened. Overall, the repetition time of the magnetic resonance sequence could thus be reduced by approximately 20 percent, and thus a distinct savings of measurement time could be achieved.

Figure 6:
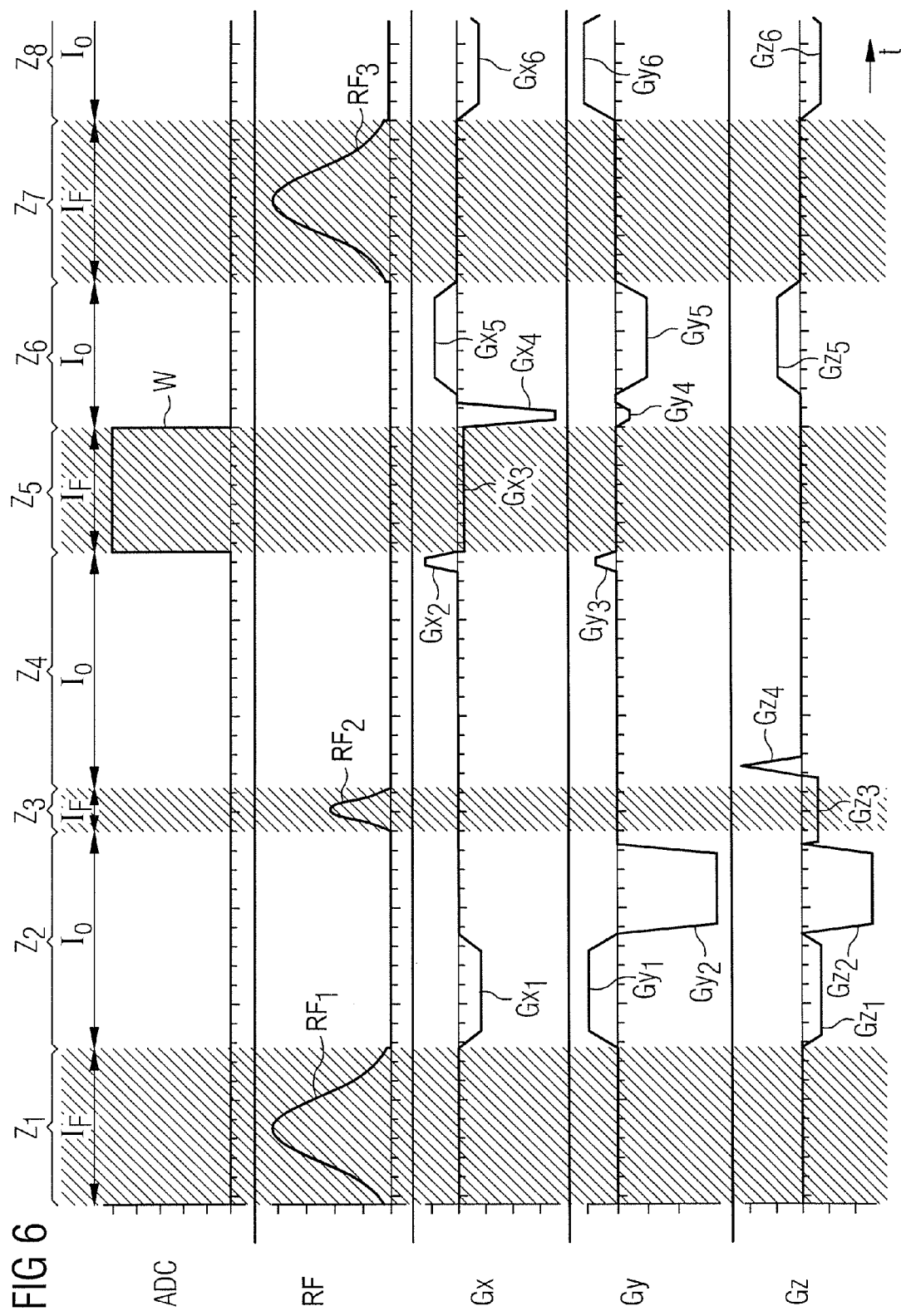
FIG. 6 shows the sequence diagram according to FIG. 3 before an optimization of gradient switchings according to one embodiment of the method according to the invention.

Finally, together with FIG. 3, FIG. 6 shows the optimization of gradient switchings of the magnetic resonance sequence according to one embodiment of the method according to the invention. FIG. 6 thus depicts the magnetic resonance sequence of FIG. 3, but without gradient switchings having been optimized. An optimization of the gradient switchings was implemented in the further method step 207 between FIG. 6 and FIG. 3. As was already noted, this optimization of the gradient switchings is optional with regard to the method according to the invention. The method according to the invention can thus proceed from the magnetic resonance sequence shown in FIG. 3 without an optimization of the gradient switchings being necessary.

With regard to the optimization of the gradient switchings, different time intervals also result, namely fixed point time intervals $I_F$ (shown with shading) in which no gradient switchings may be optimized and modifiable time intervals $I_O$ (not shown with shading) in which the gradient switchings may be optimized. Here, specifically the time intervals $Z_1$, $Z_3$, $Z_5$ and $Z_7$ in which the radio-frequency pulses $RF_1$, $RF_2$, $RF_3$ are emitted or the readout window W is switched in parallel have been identified by means of the analysis unit 33 as fixed point time intervals $I_F$ that cannot be optimized. In these time intervals, the gradients must remain at the exact predetermined amplitude values. With regard to the optimization of the gradient switchings, $Z_4$ is a modifiable time interval $I_O$ since the echo time is kept constant given the optimization of the gradient switchings.

In the modifiable time intervals $I_O$, the gradient switchings (in particular the gradient curve of the gradient switchings) may be varied arbitrarily under the following boundary conditions: the amplitude values must be maintained at the border points with the adjoining time intervals that include the fixed point time intervals $I_F$ that cannot be optimized. The first derivative at these border points must be zero. The total moment of the gradient switchings in the respective optimizable time intervals $I_O$ must be identical before and after the optimization.

The optimizable time intervals $Z_2$, $Z_4$, $Z_6$, $Z_8$ are optimized under the boundary conditions that were just cited, wherein the gradient switchings from FIG. 3 result. The optimization takes place using a spline interpolation method, wherein the amplitude values at the borders are respectively viewed as fixed points, and under the cited boundary conditions (reaching the fixed points, 1st derivative at the fixed points=0, and keeping the integral below the gradient switching curve the same) a spline leads to a desired smooth gradient switching in the respective optimizable time intervals $I_0$.

In comparison, between FIG. 6 and FIG. 1 it can be seen how adjoining, relatively angular gradient switchings $Gx_1$, $Gx_2$, $Gx_4$, $Gx_5$, $Gx_6$, $Gy_1$, $Gy_2$, $Gy_3$, $Gy_4$, $Gy_5$, $Gy_6$, $Gz_1$, $Gz_2$, $Gz_3$, $Gz_4$, $Gz_5$, $Gz_6$ with steep edges have been converted into gradient switchings that transition into one another with shapes $Gx_1'$, $Gx_2'$, $Gx_3'$, $Gx_4'$, $Gx_5'$, $Gy_1'$, $Gy_2'$, $Gy_3'$, $Gy_4'$, $Gz_1'$, $Gz_2'$, $Gz_3'$, $Gz_4'$, $Gz_5'$, $Gz_6'$ that are common in part. The optimized gradient switchings are relatively smooth, therefore provide significantly smaller loads for the gradient coils and thus significantly reduce the noise exposure. As an example for the merging of gradient switchings, in particular the merging of the gradient switchings $Gy_1$, $Gy_2$ in the original magnetic resonance sequence according to FIG. 6 into a common gradient switching $Gy_1'$ in the optimized sequence according to FIG. 3 is noted, as well as the gradient switchings $Gz_1$ through $Gz_3$ that would now be replaced by a common shape $Gz_1$, $Gz_2$, $Gz_3$ that even extends over three time intervals $Z_2$, $Z_3$, $Z_4$. In particular, here it is to be heeded that the gradient amplitude has not changed during the time interval $Z_3$ in which a slice-selective radio-frequency pulse $RF_2$ is emitted in parallel, which means that—exactly in this region—the original part of the gradient switching $Gz_3$ from FIG. 6 precisely corresponds to the gradient switching $Gz_2'$ from FIG. 3 that is present in the time interval $Z_3$. Using FIG. 3 and FIG. 6 it can be seen how—with the optimization of the gradient switchings according to the embodiment of the method according to the invention—each magnetic resonance sequence can be very quickly optimized in an effective manner, with regard to noise exposure and loading of the gradient switchings, immediately before the execution.

The present invention encompasses a method to operate a magnetic resonance apparatus, comprising entering a starting magnetic resonance sequence into a computer, said starting magnetic resonance sequence comprising a first time interval set comprising at least one time interval, and a second time interval set, comprising at least one second time interval; in said computer, automatically analyzing said starting magnetic resonance sequence to identify said at least one first time interval in the first time interval set and said at least one second time interval in the second time interval set in said starting magnetic resonance sequence; in said computer, automatically optimizing a duration of said at least one second time interval of said second time interval set, and making no modification to a duration of said at least one first time interval of said first time interval set, in order to produce an optimized magnetic resonance sequence; and making said optimized magnetic resonance sequence available in electronic form at an output of said computer, and operating said magnetic resonance apparatus with said optimized magnetic resonance sequence.

The present invention also encompasses a sequence optimization unit for optimizing a magnetic resonance sequence of a magnetic resonance apparatus, comprising, a computer having an input that receives a starting magnetic resonance sequence, said starting magnetic resonance sequence comprising a first time interval set comprising at least one time interval, and a second time interval set, comprising at least one second time interval; said computer being configured to automatically analyze said starting magnetic resonance sequence to identify said at least one first time interval in the first time interval set and said at least one second time interval in the second time interval set in said starting magnetic resonance sequence; said computer being configured to automatically optimize a duration of said at least one second time interval of said second time interval set, and make no modification to a duration of said at least one first time interval of said first time interval set, in order to produce an optimized magnetic resonance sequence; and said computer comprising an output, and being configured to make said optimized magnetic resonance sequence available in electronic form at said output of said computer, in a format for controlling a magnetic resonance apparatus.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method to optimize a magnetic resonance (MR) sequence for operating a magnetic resonance apparatus, comprising:

entering a starting magnetic resonance sequence into a computer, said starting magnetic resonance sequence comprising a first time interval set comprising at least one time interval, and a second time interval set, comprising at least one second time interval;

in said computer, automatically analyzing said starting magnetic resonance sequence to identify said at least one first time interval in the first time interval set and said at least one second time interval in the second time interval set in said starting magnetic resonance sequence;

in said computer, automatically optimizing a duration of said at least one second time interval of said second time interval set, and making no modification to a duration of said at least one first time interval of said first time interval set, in order to produce an optimized magnetic resonance sequence;

from said computer, controlling a magnetic resonance apparatus with said optimized magnetic resonance sequence in order to acquire magnetic resonance data from a subject; and In said computer, reconstructing image data from the acquired magnetic resonance data, and displaying an image, represented by said image data, at a display in communication with said computer.

2. A method as claimed in claim 1 comprising automatically optimizing said duration of said at least one second time interval using an optimization criterion that causes the optimized duration of said at least one second time interval to be minimized.

3. A method as claimed in claim 2 wherein said optimization criterion is a first optimization criterion, and wherein said magnetic resonance apparatus comprises a gradient coil arrangement having gradient coil arrangement specification parameters associated therewith, and wherein said starting magnetic resonance sequence comprises a gradient switching set comprising at least one gradient switching implemented by said gradient coil arrangement, and comprising automatically optimizing the duration of said at least one second time interval according to a second optimization criterion that an adaptation of at least one gradient switching of said gradient switching set, which takes place in said starting magnetic resonance sequence during said at least one second time interval, to the optimized duration of said at least one second time interval, is possible while complying with said gradient coil arrangement specification parameters.

4. A method as claimed in claim 3 comprising using, as said gradient coil arrangement specification parameters, at least one of a maximum allowable gradient amplitude and a maximum allowable slew rate.

5. A method as claimed in claim 1 wherein said starting magnetic resonance sequence comprises a gradient switching set comprising at least one gradient switching, and comprising, in said computer, automatically adapting said at least one gradient switching, which takes place during said at least one second time interval in said starting magnetic resonance sequence, to the optimized duration of said at least one second time interval.

6. A method as claimed in claim 5 comprising automatically adapting said at least one gradient switching while adhering to an adaptation criterion that a gradient switching moment of said at least one gradient switching in said optimized magnetic resonance sequence is kept to be the same as the gradient moment of said at least one gradient switching in said starting magnetic resonance sequence.

7. A method as claimed in claim 5 comprising automatically adapting said at least one gradient switching while adhering to an adaptation criterion that a gradient amplitude of said at least one gradient switching at fixed points in time of said optimized magnetic resonance sequence is maintained to be the same as the gradient amplitude of said at least one gradient switching at said fixed points in said starting magnetic resonance sequence, wherein said fixed points are edge values at time interval boundaries of said at least one second time interval, with an adjoining first time interval of said first time interval set.

8. A method as claimed in claim 1 comprising identifying said at least one first time interval in said magnetic resonance sequence as a time interval in which at least one event takes place that is selected from the group consisting of emission of a radio frequency pulse, readout of raw data, switching of a flow compensation gradient, and switching of a diffusion gradient.

9. A method as claimed in claim 1 comprising identifying a time interval within said starting magnetic resonance sequence as being said at least one first time interval or said at least one second time interval, by an analysis selected from the group consisting of analysis of pulse transmission times of radio frequency pulses in said starting magnetic resonance sequence, analysis of readout times in said starting magnetic resonance sequence, analysis of a shape of gradients in said starting magnetic resonance sequence, and analysis of identifiers in a parameter set associated with a gradient activation in said starting magnetic resonance sequence.

10. A method as claimed in claim 1 comprising identifying a time interval in said starting magnetic resonance sequence as a first time interval, as being a time interval in which a change in the duration thereof results in a change of at least one of an echo time produced in said starting magnetic resonance sequence and a change in a repetition time of said starting magnetic resonance sequence.

11. A method as claimed in claim 1 comprising implementing said optimization of said starting magnetic resonance sequence in said computer dependent on a manually-entered input into said computer.

12. A method as claimed in claim 1 wherein said magnetic resonance sequence comprises a gradient switching set comprising at least one gradient switching and, in said computer, also optimizing said at least one gradient switching.

13. A method as claimed in claim 12 wherein said magnetic resonance apparatus comprises a gradient coil arrangement that implements said at least one gradient switching, said gradient coil arrangement having gradient coil arrangement specification parameters associated therewith, and comprising, after optimizing said at least one gradient switching, checking, in said computer, to ensure compliance of the optimized at least one gradient switching with said gradient coil arrangement specification parameters.

14. A magnetic resonance apparatus, comprising:
a magnetic resonance data acquisition unit;
a computer provided with a starting magnetic resonance sequence, said starting magnetic resonance sequence comprising a first time interval set comprising at least one time interval, and a second time interval set, comprising at least one second time interval;
said computer being configured to automatically analyze said starting magnetic resonance sequence to identify said at least one first time interval in the first time interval set and said at least one second time interval in the second time interval set in said starting magnetic resonance sequence;
said computer being configured to automatically optimize a duration of said at least one second time interval of said second time interval set, and make no modification to a duration of said at least one first time interval of said first time interval set, in order to produce an optimized magnetic resonance sequence;
said computer being configured to operate said magnetic resonance data acquisition unit with said optimized magnetic resonance sequence in order to acquire magnetic resonance data from a subject; and
said computer being configured to reconstruct image data from the acquired magnetic resonance data, and display an image, represented by said image data, at a display in communication with said computer.

15. A non-transitory, computer-readable data storage medium encoded with programming instructions, said storage medium being loaded into a computerized control unit of a magnetic resonance apparatus, and said programming instructions causing said computerized control unit to:
receive a starting magnetic resonance sequence into a computer, said starting magnetic resonance sequence comprising a first time interval set comprising at least one time interval, and a second time interval set, comprising at least one second time interval;
analyze said starting magnetic resonance sequence to identify said at least one first time interval in the first time interval set and said at least one second time interval in the second time interval set in said starting magnetic resonance sequence;
optimize a duration of said at least one second time interval of said second time interval set, and make no modification to a duration of said at least one first time interval of said first time interval set, in order to produce an optimized magnetic resonance sequence;
control said magnetic resonance apparatus with said optimized magnetic resonance sequence in order to acquire magnetic resonance data from a subject; and
reconstruct image data from the acquired magnetic resonance data, and display an image, represented by said image data, at a display in communication with said computer.

* * * * *